(12) United States Patent
Mataki

(10) Patent No.: US 8,201,910 B2
(45) Date of Patent: *Jun. 19, 2012

(54) LINE DRAWING METHOD

(75) Inventor: Hiroshi Mataki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 232 days.

This patent is subject to a terminal disclaimer.

(21) Appl. No.: 12/656,619

(22) Filed: Feb. 4, 2010

(65) Prior Publication Data

US 2010/0220131 A1 Sep. 2, 2010

(30) Foreign Application Priority Data

Feb. 27, 2009 (JP) .................................. 2009-045227
Dec. 18, 2009 (JP) .................................. 2009-287028

(51) Int. Cl.
*B41J 29/38* (2006.01)

(52) U.S. Cl. .................................. 347/14; 347/5; 347/21
(58) Field of Classification Search .................. 347/5, 9, 347/14, 21, 12
See application file for complete search history.

(56) References Cited

U.S. PATENT DOCUMENTS

| | | | |
|---|---|---|---|
| 2008/0079769 A1* | 4/2008 | Yahiro | 347/21 |
| 2008/0238973 A1* | 10/2008 | Yamanobe | 347/14 |

FOREIGN PATENT DOCUMENTS

| | | |
|---|---|---|
| JP | 2003-266669 | 9/2003 |
| JP | 2004-000927 | 1/2004 |

* cited by examiner

*Primary Examiner* — Lam S Nguyen
(74) *Attorney, Agent, or Firm* — Jean C. Edwards, Esq.; Edwards Neils PLLC

(57) ABSTRACT

When a linear pattern is drawn on a non-permeable medium by ejecting droplets of liquid onto the non-permeable medium by using an inkjet method, drawing of the linear pattern is started from a middle portion of the linear pattern.

6 Claims, 9 Drawing Sheets

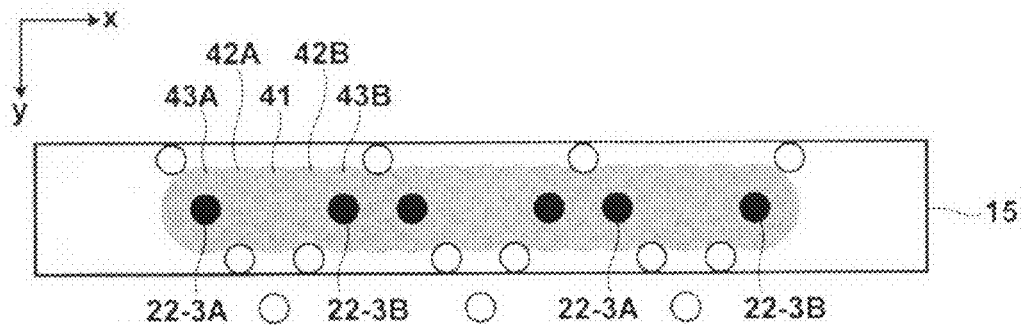
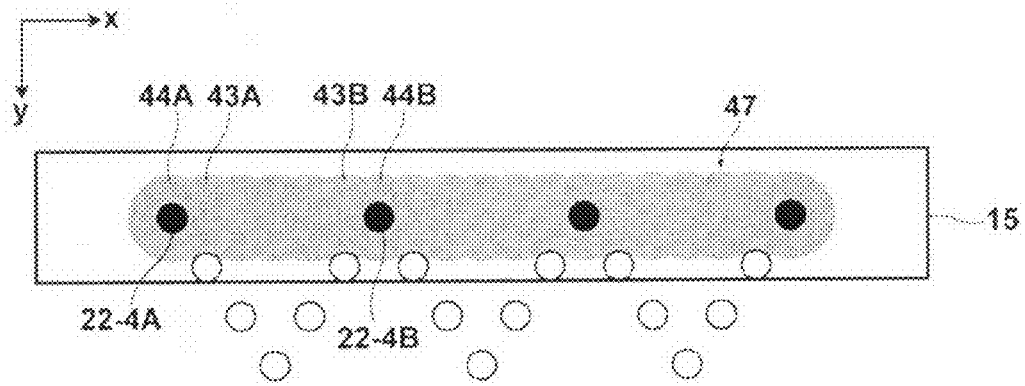
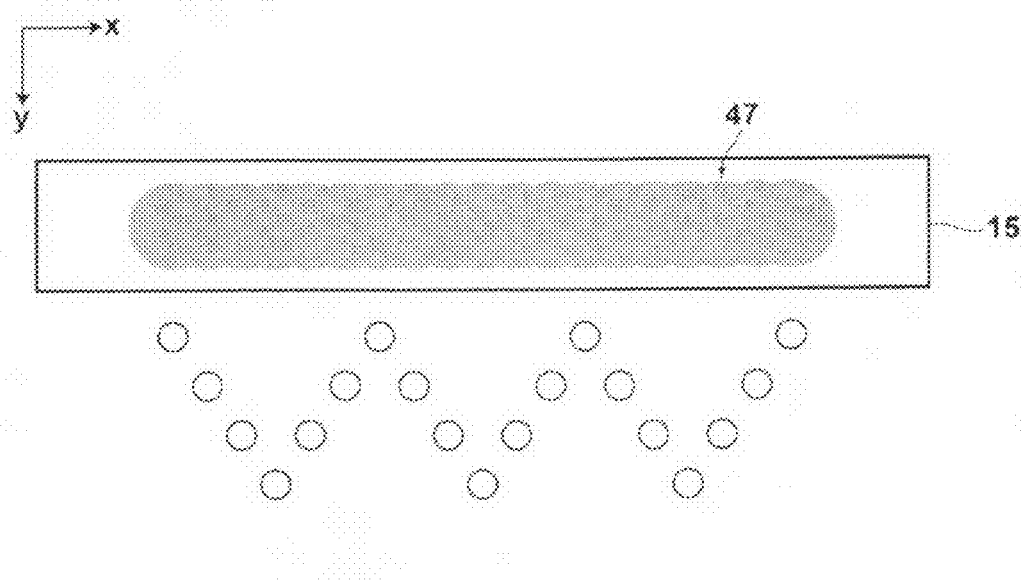

LINE DRAWING METHOD

CROSS-REFERENCE TO RELATED APPLICATIONS

The present application claims priority from Japanese Patent Application No. 2009-045227, filed Feb. 27, 2009, and Japanese Patent Application No. 2009-287028, filed Dec. 18, 2009, the contents of all of which are herein incorporated by reference in their entirety.

BACKGROUND OF THE INVENTION

1. Field of the Invention

The present invention relates to a line drawing method for drawing a linear pattern on a non-permeable material, such as resin, by using an inkjet method.

2. Description of the Related Art

In recent years, a method for directly drawing a wiring pattern of an electronic circuit on a substrate by using an inkjet method was proposed. Specifically, a printed circuit board having a desirable circuit pattern thereon can be obtained by directly drawing the desirable circuit pattern on a substrate. The desirable circuit pattern is drawn by ejecting, from an inkjet-type ejection head (inkjet head), droplets of dispersion liquid that contains electrically conductive microparticles dispersed in a dispersion medium.

Such a drawing method using the inkjet method is used not only in production of printed circuit boards. The drawing method is used also as a means for forming circuits of electrically conductive thin-films in various kinds of devices (for example, a plasma-type display device, a liquid crystal display device, an organic EL (electroluminescence) display device, or the like), thin-films as components of color filters, and the like.

Further, as a method for drawing a linear pattern by using an inkjet method, a method for drawing a linear pattern by uniting droplets of liquid that have landed on a substrate is proposed in Japanese Unexamined Patent Publication No. 2003-266669 (Patent Document 1). In Patent Document 1, the droplets of liquid are united by utilizing a phenomenon that the droplets of liquid, which are wet, spread after they land onto the substrate. Further, a method for drawing a linear pattern by depositing droplets of liquid in an overlapped manner is proposed (please refer to Japanese Patent No. 3578162 (Patent Document 2)). In Patent Document 2, after droplets of liquid are landed onto a substrate, a droplet of liquid is further landed between the droplets of liquid so that they overlap with each other.

However, when a linear pattern is drawn by using an inkjet method, an end of the linear pattern at a drawing start position tends to be thick, compared with other portions of the linear pattern, and that may lower the functional characteristic of the linear pattern.

SUMMARY OF THE INVENTION

In view of the foregoing circumstances, it is an object of the present invention to prevent an end portion of a linear pattern from becoming thick when the linear pattern is drawn.

A line drawing method of the present invention is a line drawing method for drawing a linear pattern on a non-permeable medium by applying droplets of liquid onto the non-permeable medium by using an inkjet method, wherein drawing of the linear pattern is started from a middle portion of the linear pattern, and wherein when the dot pitches of the droplets of liquid are $p[\mu m]$, the diameters of the droplets of liquid are $d[\mu m]$, and contact angles between the non-permeable medium and the droplets of liquid are $\theta[rad]$, the dot pitches $p[\mu m]$ satisfy the following condition:

$$p \leq \frac{\pi d}{6\left(\frac{\theta}{\sin^2\theta} - \frac{\cos\theta}{\sin\theta}\right)\left\{\tan\frac{\theta}{2}\left(3 + \tan^2\frac{\theta}{2}\right)\right\}^{\frac{2}{3}}}. \quad (1)$$

The phrase "middle portion of the linear pattern" means an arbitrary portion of the linear pattern other than an end portion at a drawing start position of the linear pattern. It is not necessary that the middle portion is a single portion, and a plurality of middle portions may be present.

In a line drawing method of the present invention, the linear pattern may be drawn by ejecting the droplets of liquid from an inkjet head including a plurality of linearly-arranged nozzles onto the non-permeable medium while the inkjet head and the non-permeable medium are moved relative to each other. The method may include the steps of:

moving the inkjet head and the non-permeable medium relative to each other in a direction along which the plurality of nozzles are arranged;

ejecting a droplet of liquid from a first nozzle that is located at a leading position among the plurality of nozzles with respect to the direction of the forward movement of the inkjet head relative to the non-permeable medium after the first nozzle has passed a start position of the linear pattern;

ejecting the droplets of liquid from the plurality of nozzles to the non-permeable medium sequentially in the order of arrangement of the plurality of nozzles from the first nozzle toward a second nozzle that is located farthest from the first nozzle with respect to the direction of the forward movement of the inkjet head while the droplets of liquid are ejected from the first nozzle;

ejecting the droplet of liquid from the second nozzle onto the start position of the linear pattern; and ejecting the droplet of liquid from at least one of the plurality of nozzles after the droplet of liquid is ejected onto the start position.

In a line drawing method of the present invention, the linear pattern may be drawn by ejecting the droplets of liquid from an inkjet head including a plurality of nozzles arranged in V form onto the non-permeable medium while the inkjet head and the non-permeable medium are moved relative to each other. The method may include the steps of:

moving the inkjet head and the non-permeable medium relative to each other in a first direction in such a manner that a nozzle located at a bottom portion of the V form of the plurality of nozzles is located at the leading position among the plurality of nozzles;

ejecting the droplet of liquid from the nozzle located at the bottom portion of the V form;

ejecting the droplets of liquid from nozzles located over the linear pattern to the non-permeable medium sequentially in the order of arrangement of the plurality of nozzles from the bottom portion of the V form toward upper portions of the V form while the inkjet head and the non-permeable medium are moved relative to each other in the first direction;

moving the inkjet head and the non-permeable medium relative to each other in a second direction that is perpendicular to the first direction after completing ejection of the droplets of liquid in the order of arrangement of the plurality of nozzles from the bottom portion of the V form toward the upper portions of the V form; and repeating the step of ejecting the droplets of liquid from the nozzles to the non-permeable medium in the order of arrangement of the plurality of nozzles from the bottom portion of the V form toward the upper portions of the V form and movement of the inkjet head in the second direction relative to the non-permeable medium.

In a line drawing method of the present invention, the linear pattern may be drawn by ejecting the droplets of liquid from an inkjet head including a plurality of nozzles arranged in V form onto the non-permeable medium while the inkjet head and the non-permeable medium are moved relative to each other. The method may include the steps of:

moving the inkjet head and the non-permeable medium relative to each other in a first direction in such a manner that a nozzle located at a bottom portion of the V form of the plurality of nozzles is located at a leading position among the plurality of nozzles;

ejecting the droplet of liquid from the nozzle located at the bottom portion of the V form;

ejecting the droplets of liquid from nozzles located over the linear pattern to the non-permeable medium sequentially in the order of arrangement of the plurality of nozzles from the bottom portion of the V form toward upper portions of the V form while the inkjet head and the non-permeable medium are moved relative to each other in the first direction;

moving the inkjet head and the non-permeable medium relative to each other in a second direction that is perpendicular to the first direction after completing ejection of the droplets of liquid in the order of arrangement of the plurality of nozzles from the bottom portion of the V form toward the upper portions of the V form; and ejecting the droplet of liquid from at least one of the nozzles at the upper portions of the V form while the inkjet head and the non-permeable medium are moved in the second direction relative to each other.

In a line drawing method of the present invention, the linear pattern may be drawn by ejecting the droplets of liquid from an inkjet head including at least three rows of linearly-arranged nozzles onto the non-permeable medium while the inkjet head and the non-permeable medium are moved relative to each other. Further, an interval between nozzles at both ends of each of the at least three rows of linearly-arranged nozzles may increase, row by row, at least from a first nozzle row of the at least three rows that has a smallest interval toward a second nozzle row of the at least three rows that is away from the first nozzle row at least by two rows of linearly-arranged nozzles. Further, the nozzles in the at least three rows of nozzles may be arranged in such a manner that they do not overlap with each other in a first direction that is perpendicular to each of the at least three rows of nozzles. The method may include the steps of:

moving the inkjet head and the non-permeable medium relative to each other in the first direction in such a manner that the first nozzle row is located at the leading position among the at least three rows of nozzles;

ejecting the droplets of liquid from the first nozzle row;

ejecting the droplets of liquid from nozzles located over the linear pattern to the non-permeable medium sequentially in the order of arrangement of the at least three rows of nozzles from the first nozzle row toward a third nozzle row of the at least three rows of nozzles that is located at the last position among the at least three rows of nozzles with respect to a forward direction of the at least three rows of nozzles, and while the droplets of liquid are ejected, the droplets of liquid being ejected from the second nozzle row onto the ends of the linear pattern;

moving the inkjet head and the non-permeable medium relative to each other in a second direction that is perpendicular to the first direction after completing ejection of the droplets of liquid in the order of arrangement of the at least three rows of nozzles from the first nozzle row toward the third nozzle row; and repeating the step of ejecting the droplets of liquid to the non-permeable medium in the order of arrangement of the at least three rows of nozzles from the first nozzle row to the third nozzle row and movement of the inkjet head in the second direction relative to the non-permeable medium.

In this case, the second nozzle row ejects the droplets of liquid onto the ends of the linear pattern. It is apparent that the same nozzle row is used as both of the second nozzle row and the third nozzle. In other words, a nozzle row that is located at the farthest position (last position) from the first nozzle row with respect to the forward direction of the nozzle rows may be used as the second nozzle row.

The expression "the nozzles in the at least three rows of nozzles may be arranged in such a manner that they do not overlap with each other in a first direction that is perpendicular to each of the at least three rows of nozzles" means that when a straight line passing through the center of each of the nozzles is drawn in the direction perpendicular to each of the rows of nozzles, the straight lines do not overlap (match) with each other. When the nozzles in the rows of nozzles are arranged in such a manner, it is possible to prevent a plurality of nozzles from ejecting the droplets of liquid onto the same position of the linear pattern.

Further, in a line drawing method of the present invention, an interval of printing with dots formed by the droplets of liquid may be less than or equal to 1 ms.

According to the present invention, drawing of the linear pattern is started from a middle portion of the linear pattern (a portion other than the ends of the linear pattern). Therefore, it is possible to prevent the linear pattern at the drawing start position from becoming thick.

When the interval of printing with dots formed by the droplets of liquid is less than or equal to 1 ms, it is possible to prevent formation of bulges on the linear pattern. The term "formation of bulges" means a phenomenon in which when a straight line pattern is drawn by using an inkjet method, droplets of liquid, which are wet, spread out of the linear pattern to form a bump (a projection portion) (hereinafter, this phenomenon will be referred to as "bulge (bulges)").

Further, when the dot pitch is set as represented by the above equation (1), it is possible to draw a linear pattern without generating jaggies. The term "jaggy (jaggies)" means a phenomenon in which the outlines of circuits are jagged, and they do not form smooth lines (straight lines) (Hereinafter, this phenomenon will be referred to as "jaggy (jaggies)").

BRIEF DESCRIPTION OF THE DRAWINGS

FIG. 14 is a schematic diagram illustrating a process of drawing a straight line pattern according to the second embodiment (No. 4);

FIG. 15 is a schematic diagram illustrating a process of drawing a straight line pattern according to the second embodiment (No. 5);

FIG. 16 is a schematic diagram illustrating a process of drawing a straight line pattern according to the second embodiment (No. 6);

DESCRIPTION OF THE PREFERRED EMBODIMENTS

Figure 1:
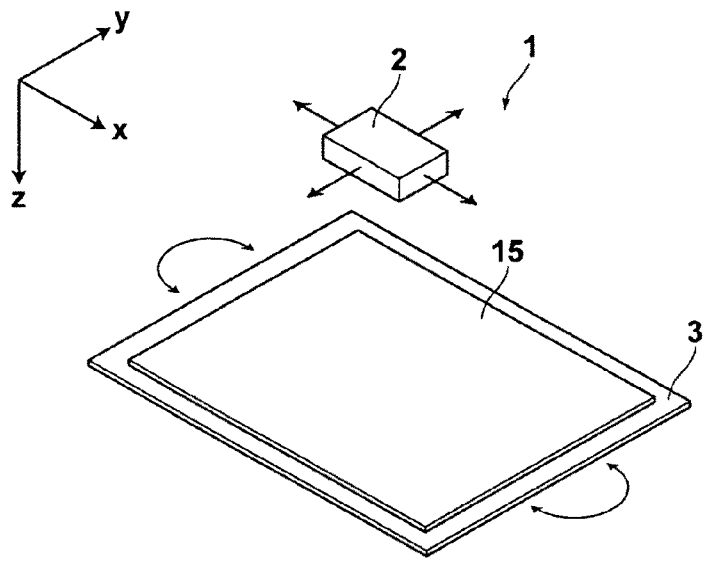
FIG. 1 is a schematic diagram illustrating a perspective view of a line drawing apparatus for carrying out a line drawing method according to a first embodiment of the present invention.

Hereinafter, embodiments of the present invention will be described with reference to drawings. FIG. 1 is a schematic diagram illustrating a perspective view of a line drawing apparatus for carrying out a line drawing method according to a first embodiment of the present invention. A line drawing apparatus 1, illustrated in FIG. 1, is a circuit drawing apparatus that draws a circuit pattern (wiring pattern) of an electronic circuit by using an inkjet method. As illustrated in FIG. 1, the line drawing apparatus 1 includes an inkjet head (hereinafter, simply referred to as "head") 2 and a support plate 3.

Figure 2:
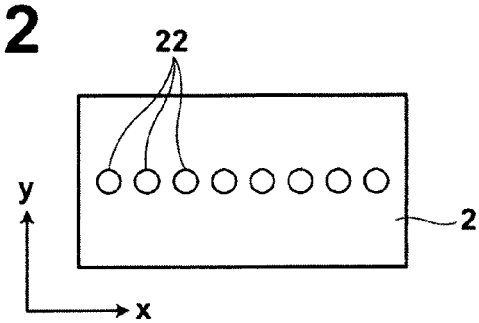
FIG. 2 is a diagram illustrating the arrangement of nozzles in a head according to the first embodiment.

The head 2 ejects (jets, outputs or the like) ink toward a substrate 15 to draw a circuit pattern on the substrate 15 by using the inkjet method. FIG. 2 is a diagram illustrating the arrangement of nozzles in the head 2 according to the first embodiment. As illustrated in FIG. 2, a plurality of nozzles 22 for ejecting ink are formed at predetermined intervals. The nozzles 22 in the head 2 are arranged in direction x illustrated in FIG. 1.

In the embodiments of the present invention, a known inkjet method, such as a bubble-jet (registered trademark) method and a piezo-jet method, may be used. The bubble-jet method uses, as an energy generation element, a thermoelectric converter, and the piezo-jet method uses a piezoelectric element.

A substrate 15, which is a medium on which drawing is carried out, and onto which droplets of liquid ejected from the head 2 adhere, is fixed to the support plate 3.

The head 2 and the support plate 3 are relatively movable with respect to each other by a drive mechanism, which is not illustrated. The positional relationship between the head 2 and the support plate 3 can be changed and controlled with respect to direction x, direction y, and direction z illustrated in FIG. 1 and the direction of rotation in xy plane.

Therefore, in the present embodiment, a head movement means (a combination of an x-direction movement means, a y-direction movement means and a z-direction movement means) that moves the head 2 in three directions x, y and z and a rotation means that rotates the support plate 3 in the xy plane are provided. However, it is not necessary that the drive mechanism that enables the relative movement of the head 2 and the support plate 3 is structured in such a manner. The drive mechanism may be structured in various manners. For example, the drive mechanism may include a rotation means that rotates the head 2 in the xy plane and a support plate movement means (a combination of an x-direction movement means, a y-direction movement means and a z-direction movement means) that moves the support plate 3 in three directions x, y and z. Alternatively, each of the head 2 and the support plate 3 may have a movement means and a rotation means.

When drawing is carried out, the position of the head 2 with respect to direction z is adjusted so that a clearance between the support plate 3 and the head 2 (specifically, a clearance between a surface of the substrate 15 on the support plate 3 and the head 2) becomes a predetermined value. The head 2 scans (moves) in direction x while the constant clearance is maintained. While the head 2 scans in direction x, droplets of liquid are ejected from the nozzles 22 of the head 2. Accordingly, a straight line in direction x is drawn on the substrate 15.

Further, the drawing position on the substrate 15 can be changed by moving the head 2 in direction y. Therefore, it is possible to land the droplets of liquid onto arbitrary positions in the drawing area of the substrate 15. Further, a straight line in an arbitrary direction can be drawn on the substrate 15 by rotating the support plate 3 and by changing the scan direction (direction x) of the head 2 and the direction of the substrate 15 (the posture of the substrate 15 corresponding to the rotation angle).

In the present embodiment, a straight line pattern is drawn by ejecting a functional liquid containing electrically-conductive microparticles from the nozzles 22 of the head 2 while the head 2 and the substrate 15 are moved (scanned), in direction x, relative to each other.

As the functional liquid for drawing circuits, a dispersion liquid in which electrically conductive microparticles are dispersed in a dispersion medium may be used. As the electrically conductive microparticles, silver nano-particles may be used for example. As the dispersion medium, a volatile medium, such as water or tetradecane, may be used for example. The electrically conductive microparticles are not limited to silver. The electrically conductive microparticles may be gold, copper, palladium, nickel, or the like.

Further, as the substrate 15, a non-permeable material (medium) that is typified by resin, or a low-permeability material that has sufficiently long penetration time may be used.

Further, drive of the head 2 and the support plate 3 is controlled by a control unit, which is not illustrated.

Next, the process of forming a straight line pattern in the first embodiment will be described. FIGS. 3 through 8 are schematic diagrams illustrating the process of drawing a straight line pattern on the substrate 15 by relatively moving the head 2 and the substrate 15 with respect to each other. Here, for the purpose of explanation, the head 2 is supposed to have four nozzles 22A through 22D.

Figure 3:
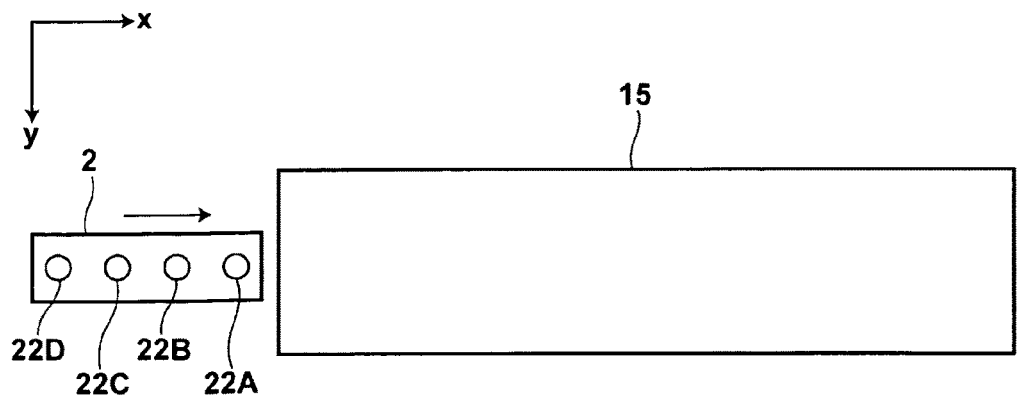
FIG. 3 is a schematic diagram illustrating a process of drawing a straight line pattern according to the first embodiment (No. 1)

FIG. 3 is a diagram illustrating a state before drawing. From this state, the head 2 is moved in direction x until the head 2 reaches a predetermined position (drawing position) over the substrate 15.

Figure 4:
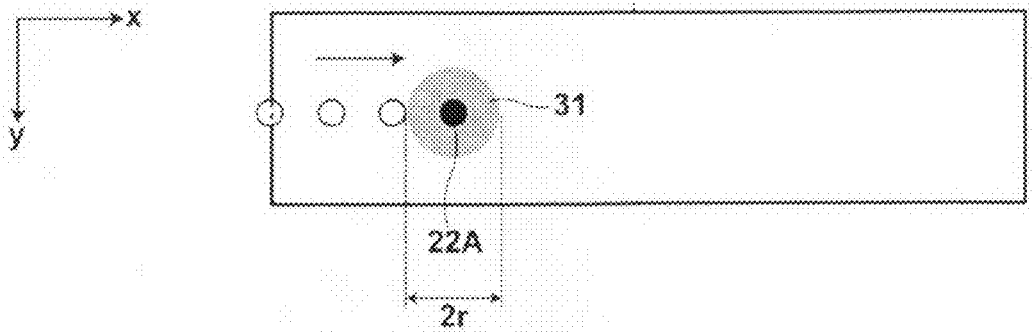
FIG. 4 is a schematic diagram illustrating a process of drawing a straight line pattern according to the first embodiment (No. 2)

When the head 2 reaches the predetermined drawing position, the nozzle 22A, which is located at a leading position among the four nozzles 22A through 22D in the direction of movement of the head 2, ejects liquid onto the substrate 15, as illustrated in FIG. 4. In FIG. 4 and in the following explanation, a circular gray area indicates a spread area of a dot (a droplet of liquid that has landed) ejected by the nozzles 22A through 22D. In the process illustrated in FIG. 4, the droplet of liquid is ejected only from the nozzle 22A. Therefore, only an isolated circular dot 31 is formed.

Figure 5:
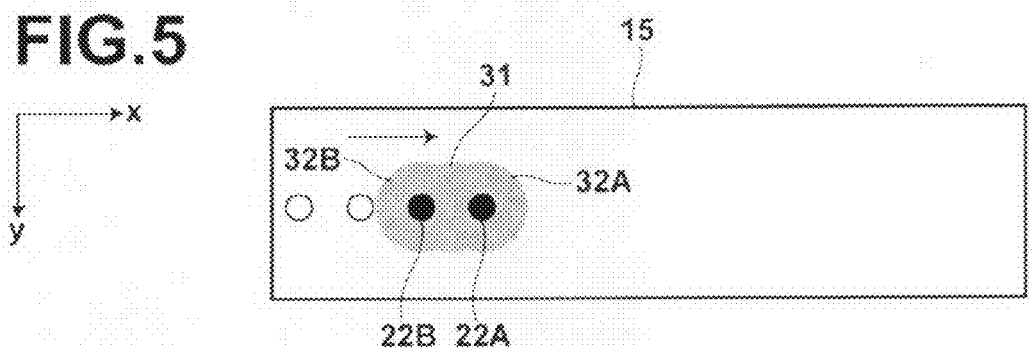
FIG. 5 is a schematic diagram illustrating a process of drawing a straight line pattern according to the first embodiment (No. 3)

Next, as illustrated in FIG. 5, the nozzles 22A and 22B simultaneously eject droplets of liquid at appropriate ejection timing (print time interval) based on the scan speed in direction x. Accordingly, dots 32A and 32B are formed next to each other in direction x with the dot 31 located at a middle between the dots 32A and 32B.

The dot pitch in the present embodiment is less than or equal to diameter 2r of the landed droplet of liquid (r represents the radius of a landed droplet of liquid). Therefore, each of the dots 32A and 32B contacts with the dot 31 that is located at the middle on the substrate 15. Accordingly, the three dots 32A, 31 and 32B join together.

In the present embodiment, high-speed drawing is performed at a frequency of printing of 1 kHz or higher, and optionally at a frequency of printing of 10 kHz or higher. The frequency of printing is the number of times of landing by droplets of liquid on the substrate per second. When drawing is performed at high speed as described above, it is possible to prevent formation of bulges on linear patterns.

Figure 6:
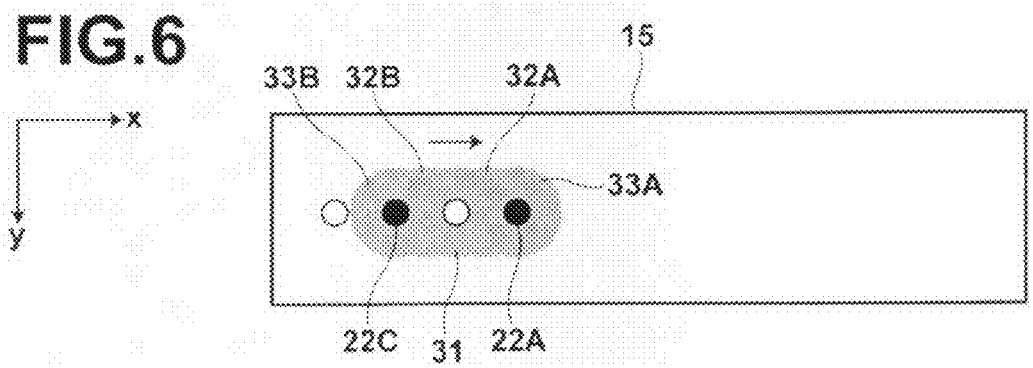
FIG. 6 is a schematic diagram illustrating a process of drawing a straight line pattern according to the first embodiment (No. 4)

Next, as illustrated in FIG. 6, droplets of liquid are simultaneously ejected from the nozzles 22A and 22C at appropriate timing based on the scan speed in direction x. Accordingly, dots 33A and 33B are formed next to the dots 32A and 32B, respectively. The dots 33A and 33B are located further on the outside of the dot 32A, and on the outside of the dot 32B, respectively.

Figure 7:
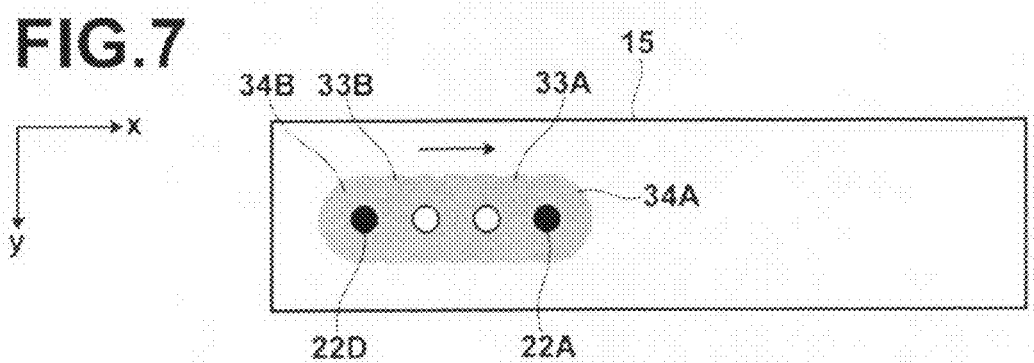
FIG. 7 is a schematic diagram illustrating a process of drawing a straight line pattern according to the first embodiment (No. 5)

Next, as illustrated in FIG. 7, droplets of liquid are simultaneously ejected from the nozzles 22A and 22D at appropriate timing based on the scan speed in direction x. Accordingly, dots 34A and 34B are formed next to the dots 33A and 33B, respectively. The dots 34A and 34B are located further on the outside of the dot 33A, and on the outside of the dot 33B, respectively.

Figure 8:
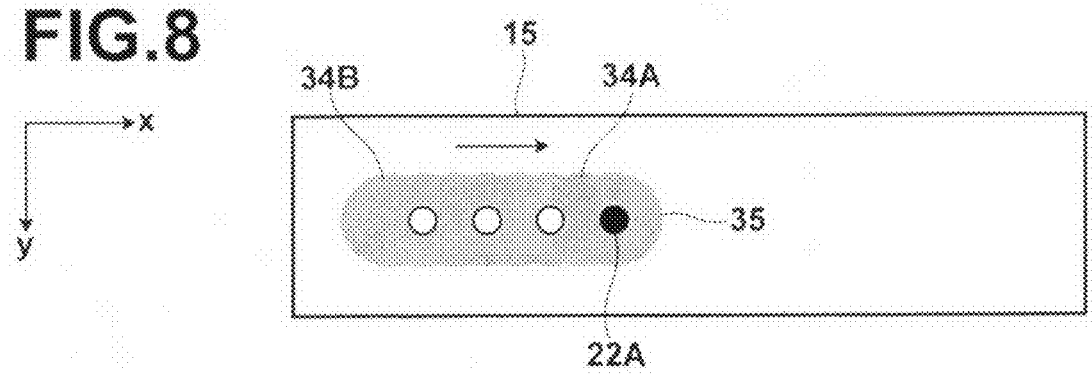
FIG. 8 is a schematic diagram illustrating a process of drawing a straight line pattern according to the first embodiment (No. 6)

Further, as illustrated in FIG. 8, droplets of liquid are ejected only from the nozzle 22A at appropriate ejection timing based on the scan speed in direction x. Accordingly, a dot 35 next to the dot 34A is formed. The dot 35 is located further on the outside of the dot 34A. After then, the droplets of liquid are ejected only from the nozzle 22A at appropriate ejection timing based on the scan speed in direction x, and a straight line pattern is drawn. In the process illustrated in FIG. 7 or later process, droplets of liquid may be ejected from at least one of the nozzles 22B through 22D or from all of the nozzles 22A through 22D to draw a straight line pattern.

In FIGS. 3 through 8, the shape of the dot is a circle to clearly indicate the positional relationship between the dots. However, in actual operations, the droplets of liquid join together on the substrate 15 when the droplets of liquid land on the substrate 15. Therefore, the outline of the straight line pattern is a smooth straight line that does not include uneven patterns corresponding to the dots. Hence, jaggies are not generated.

Here, the dot pitch for drawing a straight line pattern using ink or the like that is sufficient for drawing a line having a necessary line width is determined so as to satisfy the following equation (1):

$$p \leq \frac{\pi d}{6\left(\frac{\theta}{\sin^2\theta} - \frac{\cos\theta}{\sin\theta}\right)\left\{\tan\frac{\theta}{2}\left(3 + \tan^2\frac{\theta}{2}\right)\right\}^{\frac{2}{3}}}. \quad (1)$$

In equation (1), p[μm] is a dot pitch, and θ[rad] is a contact angle between the substrate 15 and the droplet of liquid.

Figure 9:
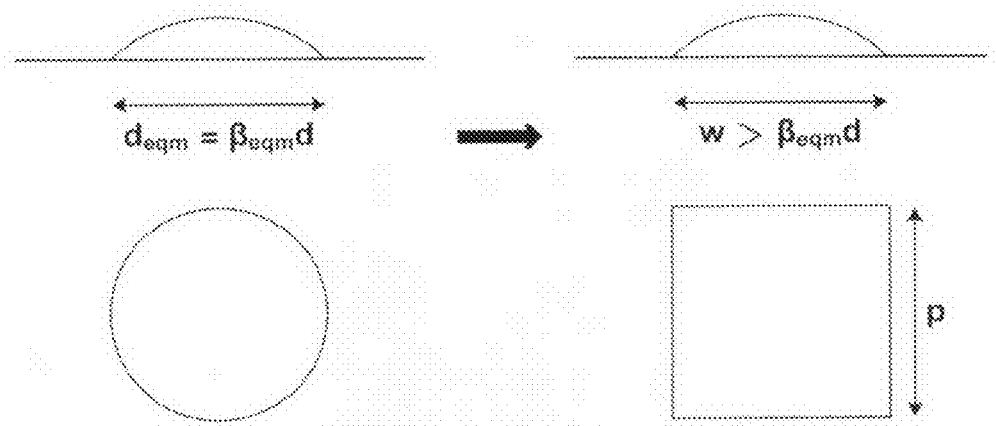
FIG. 9 is a diagram for explaining calculation of a dot pitch.

Next, calculation of the dot pitch represented by equation (1) will be described. FIG. 9 is a diagram for explaining calculation of the dot pitch. As illustrated in FIG. 9, it is assumed that when drawing is performed at dot pitch p[μm], a droplet of liquid landed on the substrate 15 spreads on the substrate 15, and forms a part of the straight line pattern having line width w[μm]. It is assumed that the part of the straight line pattern, formed by the droplet of liquid, has semi-cylindrical form with a width of w[μm] and a length that is the same as dot pitch p[μm]. Further, it is assumed that the volume of the droplets of liquid ejected from the head 2 is stored, and that the contact angle between the substrate 15 and the droplet of liquid does not change after the droplet of liquid lands on the substrate 15.

As illustrated in FIG. 9, when the diameter of the droplet of liquid ejected from the nozzle of the head 2 is d[μm], the diameter of the droplet of liquid at equilibrium after landing on the substrate 15 is $d_{eqm}$[μm], the ratio $d_{eqm}/d$ between $d_{eqm}$[μm] and d[μm] is $\beta_{eqm}$, $\beta_{eqm}$ is represented by the following equation (2):

$$\beta_{eqm} = \frac{d_{eqm}}{d} = 2\left\{\left(\tan\frac{\theta}{2}\right)\left(3 + \tan^2\frac{\theta}{2}\right)\right\}^{-\frac{1}{3}}. \quad (2)$$

Meanwhile, the area A0 of the cross-section of the semi-cylinder having the width of w[μm] and the length that is the same as the dot pitch p[μm] is represented by the following equation (3). Therefore, the volume V0 of the semi-cylinder is represented by the following equation (4):

$$A0 = \frac{1}{4}w^2\left(\frac{\theta}{\sin^2\theta} - \frac{\cos\theta}{\sin\theta}\right) \quad (3)$$

$$V0 = \frac{1}{4}w^2 p\left(\frac{\theta}{\sin^2\theta} - \frac{\cos\theta}{\sin\theta}\right). \quad (4)$$

Meanwhile, since the diameter of the droplet of liquid ejected from the nozzle is d[μm], the volume V1 of the droplet of liquid is represented by the following equation (5):

$$V1 = \frac{1}{6}\pi d^3. \quad (5)$$

Since the volume V0 of the semi-cylinder and the volume V1 of the droplet of liquid are the same, a relationship represented by the following equation (6) is satisfied. Further, the line width w[μm] may be calculated based on the equation (6), as represented by the following equation (7):

$$\frac{1}{4}w^2 p\left(\frac{\theta}{\sin^2\theta} - \frac{\cos\theta}{\sin\theta}\right) = \frac{1}{6}\pi d^3 \quad (6)$$

$$w = \sqrt{\frac{2\pi d^3}{3p\left(\frac{\theta}{\sin^2\theta} - \frac{\cos\theta}{\sin\theta}\right)}}. \quad (7)$$

The line width w[μm] of the straight line pattern is greater than or equal to the diameter $d_{eqm}$[μm] of the ink or the like at equilibrium after landing on the substrate 15. Specifically, $w \leq d_{eqm} = \beta_{eqm} \cdot d$. Therefore, when this relationship is used and the equation (7) is solved with respect to p[μm], the following equation (1) is obtained:

$$p \leq \frac{2\pi d}{3\beta_{eqm}^2\left(\frac{\theta}{\sin^2\theta} - \frac{\cos\theta}{\sin\theta}\right)} = \frac{\pi d}{6\left(\frac{\theta}{\sin^2\theta} - \frac{\cos\theta}{\sin\theta}\right)\left\{\tan\frac{\theta}{2}\left(3 + \tan^2\frac{\theta}{2}\right)\right\}^{\frac{2}{3}}}. \quad (1)$$

When a straight line pattern is drawn at the dot pitch calculated by the equation (1), it is possible to prevent generation of jaggies.

Next, the result of our experiments will be described. Table 1 shows the result of experiments when the size of the droplet of liquid (ejection volume) is 10 pl (pico liter), and the diameter of a landed droplet of ink or the like is 55 μm. In the experiments, the frequency of printing and the dot pitch in drawing the straight line patterns were changed to observe the stability in the line width (generation of bulges and jaggies).

In Table 1, generation of bulges and jaggies in drawn lines was visually observed and evaluated. When the level of the straight line pattern was sufficiently high and suitable for practical use, the straight line pattern was judged as "o". When the level of the straight line pattern was low, the straight was judged as "x". According to the result of experiments shown in Table 1, when the frequency of printing was greater than or equal to 1000 Hz (=1 kHz), the line width was stable, and bulges and jaggies were not generated.

TABLE 1

| Frequency of Printing [Hz] | Dot Pitch [μm] | | | |
|---|---|---|---|---|
| | 20 | | 40 | |
| | Bulge | Jaggy | Bulge | Jaggy |
| 10 | x | o | o | x |
| 1000 | o | o | o | o |
| 10000 | o | o | o | o |

As described above, in the first embodiment of the present invention, drawing of the straight line pattern is started from a middle portion of the straight line pattern. Therefore, it is possible to prevent the line at the start position of the linear pattern from becoming thick.

When the frequency of printing of dots formed by droplets of liquid is set at 1 kHz or higher, it is possible to prevent formation of bulges on the straight line pattern.

Further, when the dot pitch during drawing of the straight line pattern is set so as to satisfy the equation (1), it is possible to draw a straight line pattern without generating jaggies.

In the first embodiment of the present invention, the head 2 including a plurality of nozzles is used. Alternatively, the head 2 having only a single nozzle may be used. In such a case, the ink or the like should be ejected onto the substrate 15 after the head 2 passes the start position of the straight line pattern. After then, the head 2 should be moved back to the start position of the straight line pattern, and the ink or the like should be ejected while the head 2 and the substrate 15 are moved relative to each other. Accordingly, a straight line is drawn.

Figure 10:
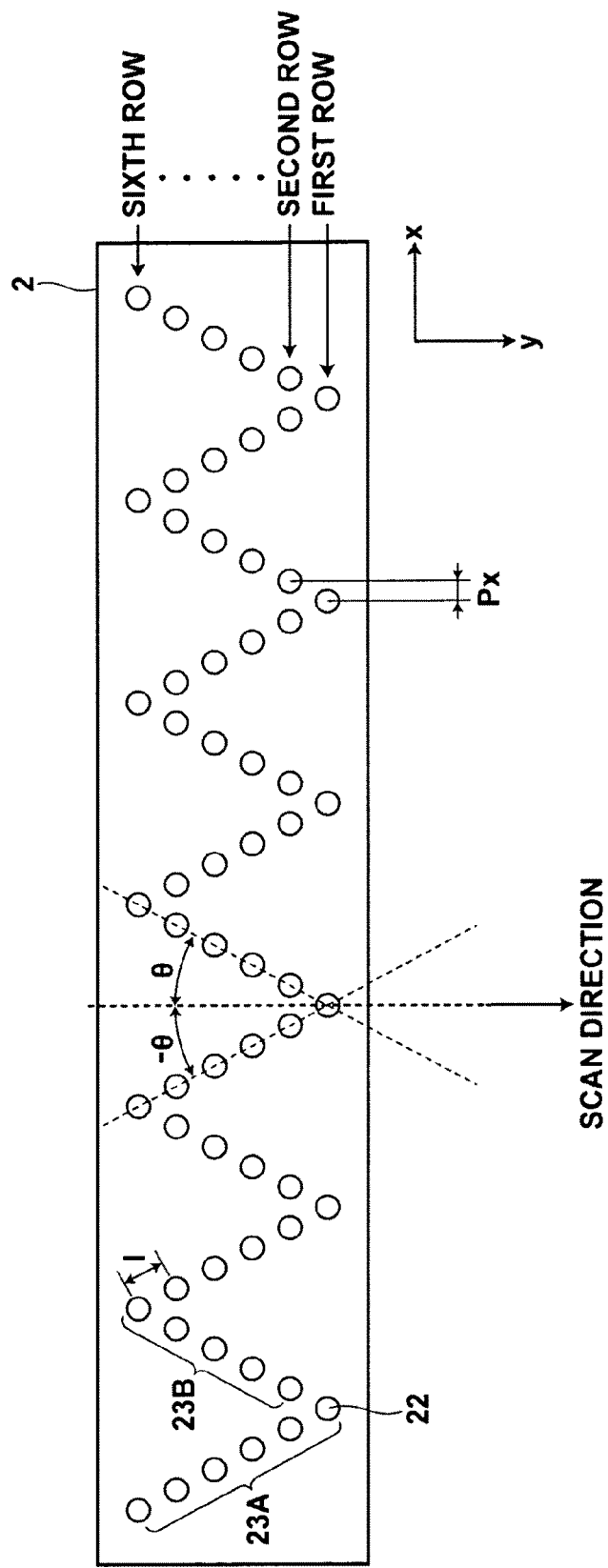
FIG. 10 is a diagram illustrating the arrangement of nozzles in a head according to a second embodiment.

Next, a second embodiment of the present invention will be described. In the second embodiment, only the arrangement of the nozzles in the head 2 and the manner of drawing the straight line pattern differ from the first embodiment. Therefore, the detailed descriptions of the apparatus will be omitted. FIG. 10 is a diagram illustrating the arrangement of nozzles of the head 2 according to the second embodiment. As illustrated in FIG. 10, a plurality of nozzles 22 are arranged on the ink-output surface of the head 2. The plurality of nozzles 22 are arranged, in zigzag form, from an end (left end in FIG. 10) of the head 2 to the other end of the head 2 in the longitudinal direction (direction x) of the head 2.

Specifically, the arrangement of the nozzles 22 is a combination of V-shaped arrangements, which are connected to each other. Nozzle arrays 23A, each including a plurality of nozzles 22 (six nozzles in this case), and nozzle arrays 23B, each including a plurality of nozzles 22, are continuously combined in alternate manner along direction x. In each of the nozzle arrays 23A, the nozzles 22 are arranged at predetermined intervals I along a straight line in an oblique direction with respect to the scan direction of the head 2 (direction y). The nozzles in each of the nozzle arrays 23B are arranged along a straight line in an inverse oblique direction, which is an oblique direction slanted in an opposite direction to the slanting direction of the nozzle array 23A. An end of each of the nozzle arrays 23B is connected to an end of an adjacent nozzle array 23A. In FIG. 10, the number of nozzles (the number of rows of nozzles) constituting a V-shaped arrangement of nozzles, which is the unit of repeating pattern, is six in direction y. However, it is not necessary that the number of the rows is six, and an appropriate number of rows that is greater than or equal to three may be adopted.

In the arrangement of nozzles illustrated in FIG. 10, interval Px of the nozzles indirection x is constant (equidistant). Meanwhile, in each of the nozzle arrays 23A and 23B, the nozzles are linearly arranged in oblique directions (−θ direction and +θ direction, respectively) with respect to the scan direction (direction y). In each of the nozzle arrays 23A and 23B, the nozzles are arranged in such a manner that the interval I of the nozzles adjacent to each other in the oblique direction are constant (equidistant).

When the angle formed by a nozzle array (23A), which is one of the nozzle arrays of V shape, and the scan direction (direction y) is −θ, the angle formed by the other nozzle array (23B) of the V shape and the scan direction is +θ. In this manner, the units of V-shaped repeating pattern that is symmetrical with respect to the scan direction are continuously connected to each other along direction x.

Next, the process of forming a straight line pattern in the second embodiment will be described. FIGS. 11 through 16 are schematic diagrams illustrating the manner of drawing a straight line pattern on the substrate 15 while the head 2 and the substrate 15 are moved relative to each other. Here, for the purpose of explanation, a smaller number of nozzles arranged in V shape are illustrated. In the second embodiment, the interval of printing by ejecting ink or the like is less than or equal to 1 ms, which corresponds to the frequency of printing of 1 kHz or greater in the first embodiment.

Figure 11:
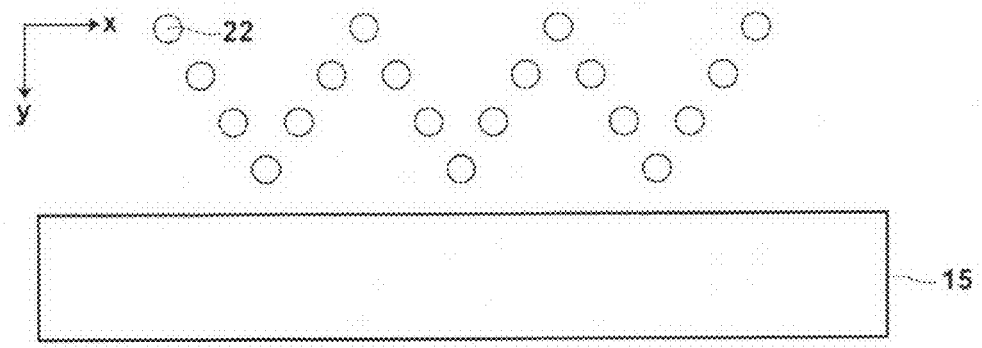
FIG. 11 is a schematic diagram illustrating a process of drawing a straight line pattern according to the second embodiment (No. 1)

FIG. 11 is a diagram illustrating a state before drawing. From this state, the head 2 is moved in direction y, and the head 2 reaches a predetermined position (drawing position) over the substrate 15.

Figure 12:
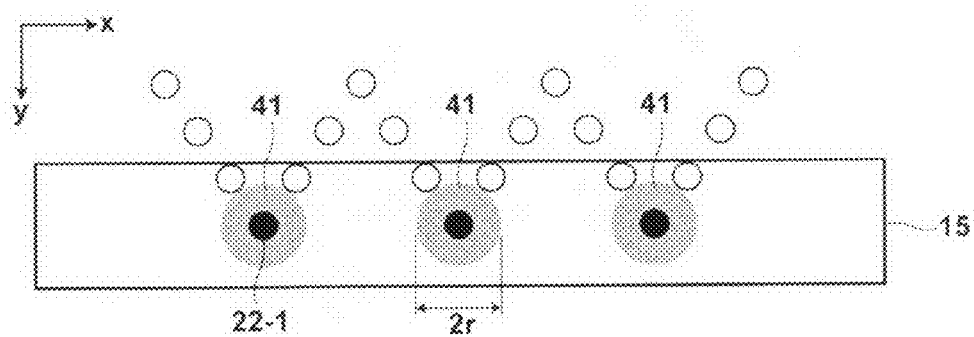
FIG. 12 is a schematic diagram illustrating a process of drawing a straight line pattern according to the second embodiment (No. 2)

When the head 2 reaches the predetermined drawing position, droplets of liquid are ejected from nozzles 22-1, as illustrated in FIG. 12. The nozzles 22-1 are nozzles in the first row (a nozzle located at the bottom of the V shape). Each of the nozzles 22-1 is located at a leading position among the group of nozzles in V shape with respect to the scan direction (direction y).

In the process illustrated in FIG. 12, the droplets of liquid are ejected only from the nozzles 22-1 in the first row. Therefore, dots 41 ejected from the nozzles 22-1 do not contact with each other. The dots 41 are formed as isolated dots (independent dots), and arranged in a line along direction x.

Figure 13:
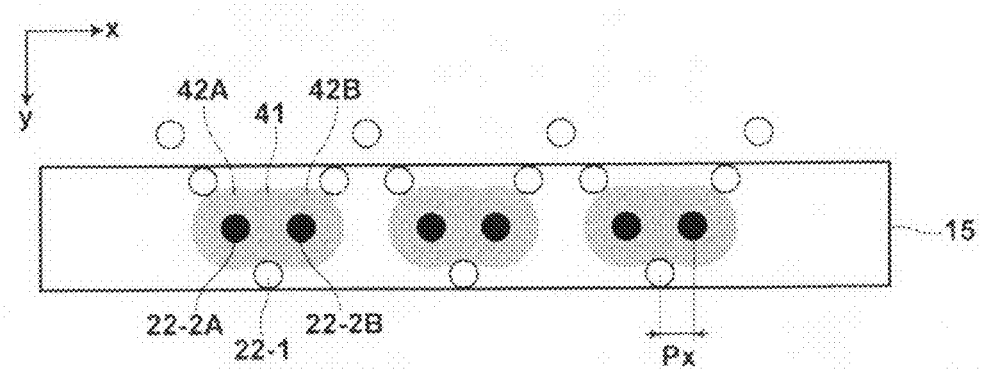
FIG. 13 is a schematic diagram illustrating a process of drawing a straight line pattern according to the second embodiment (No. 3)

Next, as illustrated in FIG. 13, droplets of liquid are ejected simultaneously from nozzles 22-2A and 22-2B, which are in the second row, at appropriate ejection timing corresponding to the scan speed in direction y. Accordingly, dots 42A and 42B, which are next to each other with the dot 41 located at middle between the dots 42A and 42B, are formed.

In the arrangement of nozzles of the second embodiment, interval Px of the nozzles in direction x is less than or equal to the diameter 2r of the landed droplet of liquid (r represents the radius of the landed droplet of liquid). Further, the dots 42A and 42B contact with the dot 41, which is located at the middle, on the substrate 15, and these three dots 42A, 41, and 42B join together.

Next, as illustrated in FIG. 14, droplets of liquid are ejected simultaneously from nozzles 22-3A and 22-3B, which are in the third row, at appropriate ejection timing corresponding to the scan speed in direction y. Accordingly, dots 43A and 43B are formed next to the dots 42A and 42B, respectively. In each group of dots corresponding to a unit of V-shaped repeating pattern, the dots 43A and 43B are located on the outside of the dot 42A and on the outside of the dot 42B, respectively.

Next, as illustrated in FIG. 15, droplets of liquid are ejected simultaneously from nozzles 22-4A and 22-4B, which are in the fourth row, at appropriate ejection timing corresponding to the scan speed in direction y. Accordingly, dots 44A and 44B are formed next to the dots 43A and 43B, respectively. In each group of dots corresponding to a unit of V-shaped repeating pattern, the dots 44A and 44B are located further on the outside of the dot 43A and on the outside of the dot 43B, respectively. Accordingly, all of the landed droplets of liquid next to each other in direction x join together, and a predetermined length of straight line (segment) 47 is drawn. FIG. 16 illustrates a state in which the head 2 has been moved after drawing the segment 47.

In FIGS. 11 through 16, the dots are illustrated in circular form to clearly indicate the positional relationship of the dots. However, in actual operations, the landed droplets of liquid join together on the substrate 15, and uneven patterns corresponding to the dots are not formed. Therefore, the outline of the segment 47 is a smooth straight line, and no jaggies are generated.

As described above, a single segment 47 is drawn in one scan operation. In this drawing operation, all of the droplets of liquid are ejected from different nozzles from each other.

Next, the head 2 is moved in direction x by the length of the segment 47, and the head 2 reaches the drawing position illustrated in FIG. 12. Then, droplet ejection control operations illustrated in FIGS. 12 through 16 and the movement of the head 2 in direction x by the length of the segment 47 are repeated. Accordingly, a straight line pattern including a plurality of segments 47 connected to each other is drawn on the substrate 15.

In the second embodiment, a segment that has a different length can be drawn by using a part of the nozzles arranged in the head 2. The range of the nozzles corresponding to the segment (from an end of the segment to the other end of the segment) is determined based on the length of the straight line to be drawn. When all of the nozzles in the determined range are used, and droplet ejection control operations are performed in a manner similar to the operations illustrated in FIGS. 12 through 16, a segment that has a desirable length is formed.

As illustrated in FIGS. 12 through 16, in embodiment 2, drawing is started not from an end of the segment 47 but from a middle portion of the segment 47. Therefore, it is possible to prevent the line at the start position of the straight line pattern from becoming thick.

Figure 17:
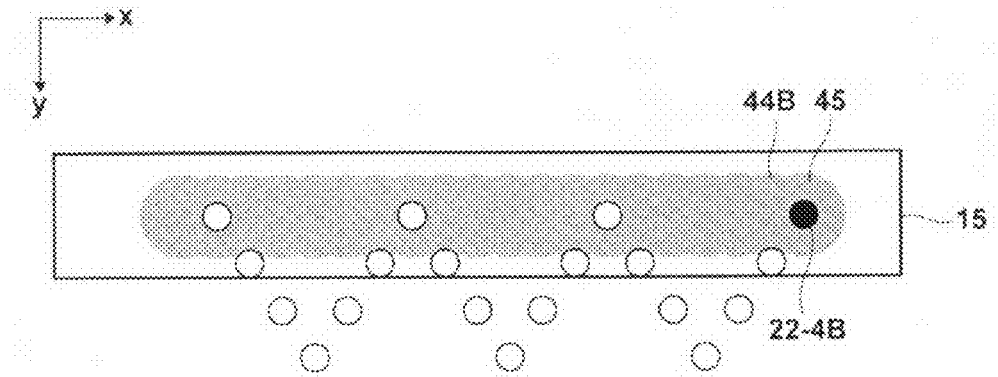
FIG. 17 is a schematic diagram illustrating a process of drawing a straight line pattern according to a third embodiment.

In the second embodiment, the straight line pattern is drawn by repeating the movement of the head 2 in direction x by the length of the segment 47 and the droplet ejection control operations illustrated in FIGS. 12 through 16. However, it is not necessary that the operation is performed in such a manner. Alternatively, after the segment 47 is drawn as illustrated in FIG. 15, the head 2 may be moved in direction x, and while the head 2 is moved, a dot 45 may be formed on the outside of the dot 44B that is located on the right end of the segment 47, as illustrated in FIG. 17. The dot 45 is formed by ejecting a droplet of liquid only from the nozzle 22-4B located at the leading position among the nozzles of the head 2 with respect to the movement direction of the head 2. Further, ejection of droplets of liquid only from the nozzle 22-4B located at the leading position among the nozzles of the head 2 with respect to the movement direction is repeated at ejection timing appropriate for the scan speed in direction x. In such a manner, a straight line pattern that has a desirable length may be drawn (Third Embodiment). In this case, the straight line pattern may be drawn by ejecting droplets of liquid from all of the nozzles 22-4B over the segment 47 in the state illustrated in FIG. 15.

Figure 18:
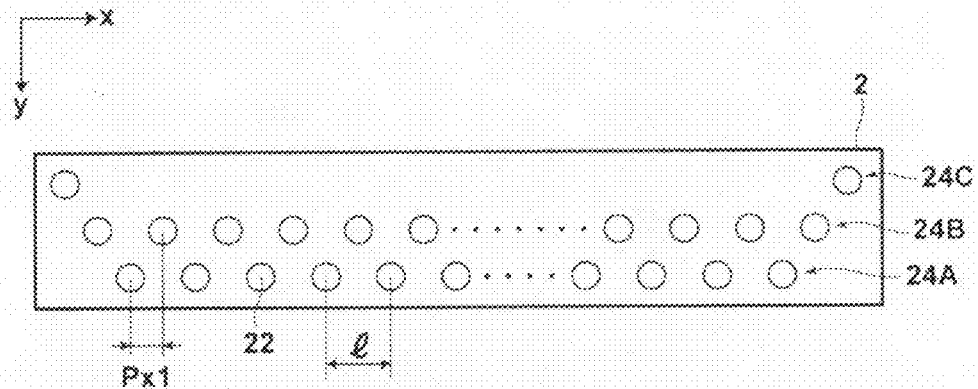
FIG. 18 is a diagram illustrating the arrangement of nozzles in a head according to a fourth embodiment.

Next, a fourth embodiment of the present invention will be described. In the fourth embodiment, only the arrangement of the nozzles in the head 2 and the manner of drawing the straight light pattern differ from the first embodiment. Therefore, the detailed descriptions of the apparatus will be omitted. FIG. 18 is a diagram illustrating the arrangement of nozzles in the head 2 according to the fourth embodiment. As illustrated in FIG. 18, three nozzle rows 24A, 24B, and 24C, which are first through third nozzle rows, are formed on the output surface (ejection surface) of the head 2. In each of the nozzle rows 24A, 24B, and 24C, a plurality of nozzles 22 are arranged in the longitudinal direction of the head 2 (direction x) at predetermined intervals. Further, the interval of the nozzles on both ends of each of the nozzle rows 24A, 24B, and 24C increases, row by row, from the first nozzle row 24A, which is located at the leading position with respect to the scan direction of the head 2 (direction y) toward the third nozzle row 24C. The interval increases, row by row, by a distance corresponding to a pixel.

Here, when a straight line pattern is drawn, it is necessary that the nozzles 22 in the first through third nozzle rows 24A, 24B, and 24C do not overlap with each other (specifically, do not overlap with nozzles in other rows) with respect to the direction perpendicular to each of the nozzle rows so that droplets of liquid are not ejected to the same position of the pattern a plurality of times. Therefore, the nozzles 22 in the first and second nozzle rows 24A and 24B are formed in such a manner that the nozzles 22 in the first nozzle row 24A are located between the nozzles 22 in the second nozzle row 24B with respect to the direction of each of the first and second nozzle rows 24A and 24B. When the nozzles 22 are formed in such a manner, the nozzles are arranged as illustrated in FIG. 18. Specifically, the nozzles 22 in the first and second nozzle rows 24A and 24B are arranged in trapezoid in which the upper side of the trapezoid is longer than the lower side of the trapezoid. The nozzles 22 are arranged in such a manner that the nozzles of the first and second nozzle rows 24A and 24B do not overlap with each other with respect to the direction perpendicular to the nozzle rows. Meanwhile, with respect to the third nozzle row 24C, when the nozzles 22 in the third nozzle row 24C are formed in such a manner that the nozzles in the third nozzle row 24C are located between the nozzles 22 in the second nozzle row 24B with respect to the direction of each of the nozzle rows, the nozzles 22 in the third nozzle row 24C and the nozzles in the first nozzle row 24A overlap with each other with respect to the direction perpendicular to the nozzle rows. Therefore, with respect to the third nozzle row 24C, only two nozzles 22 at both ends of the third nozzle row 24C are formed. Alternatively, the nozzles 22 may be formed in the entire range of the third nozzle row 24C in such a manner that the nozzles 22 in the third nozzle row 24C do not overlap with the nozzles of the first and second nozzle rows 24A and 24B.

In the arrangement of the nozzles illustrated in FIG. 18, interval Px1 of nozzles in direction x is constant (equidistant). Further, in each of the first and second nozzle rows 24A and 24B, interval l of nozzles adjacent to each other in direction x is constant (equidistant).

Next, the process of forming the straight line pattern in the fourth embodiment will be described. FIG. 19 through 23 are schematic diagrams illustrating the manner of drawing a straight line pattern on the substrate 15 by moving the head 2 and the substrate 15 relative to each other. Here, for the purpose of explanation, a smaller number of nozzles are illustrated in the nozzle rows 24A, 24B and 24C. Further, in the fourth embodiment, the interval of printing by ejecting droplets of liquid is less than or equal to 1 ms, which corresponds to the frequency of printing of greater than or equal to 1 kHz in the first embodiment.

Figure 19:
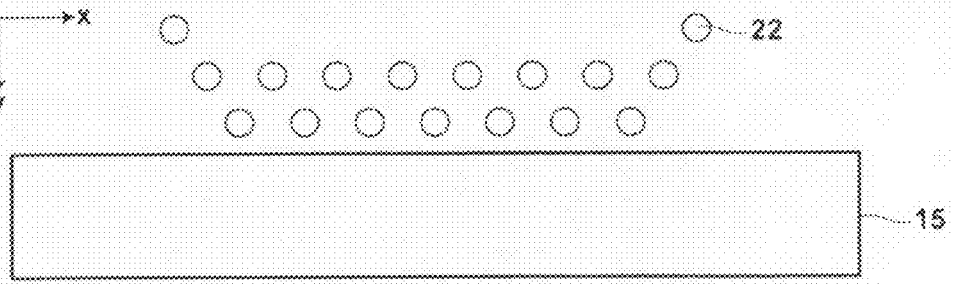
FIG. 19 is a schematic diagram illustrating a process of drawing a straight line pattern according to the fourth embodiment (No. 1)

FIG. 19 is a diagram illustrating a state before drawing. The head 2 is moved from this state in direction y, and head 2 reaches a predetermined position (drawing position) over the substrate 15.

Figure 20:
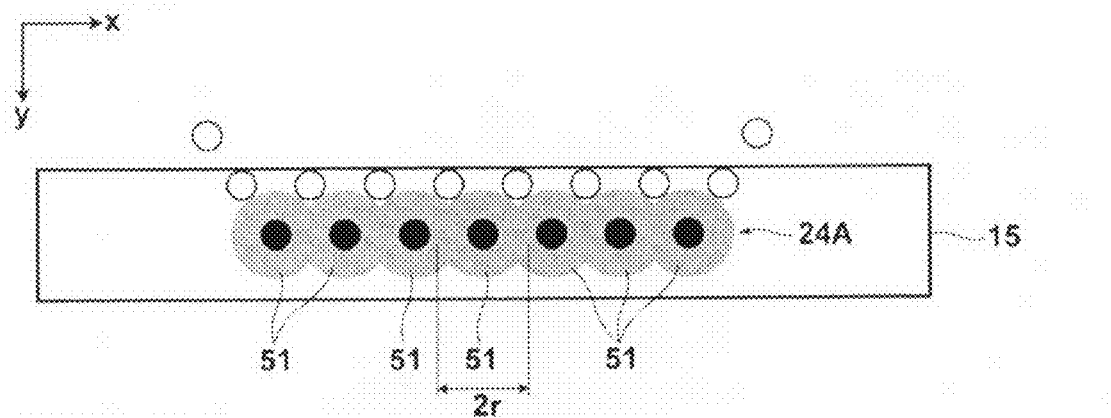
FIG. 20 is a schematic diagram illustrating a process of drawing a straight line pattern according to the fourth embodiment (No. 2)

When the head 2 reaches the predetermined drawing position, droplets of liquid are ejected simultaneously from the nozzles 22 in the first nozzle row 24A, which is located at the leading position toward the scan direction (direction y), as illustrated in FIG. 20. Accordingly, dots 51 are formed in such a manner to align in the direction of arrangement of the nozzles 22 in the nozzle row 24A.

In the fourth embodiment, interval l of nozzles adjacent to each other in each of the first and second nozzle rows 24A and 24B is less than or equal to diameter 2r of the landed droplet of liquid (r represents the radius of the landed droplet of liquid). Therefore, the dots 51 next to each other contact with each other on the substrate 15, and join together.

Figure 21:
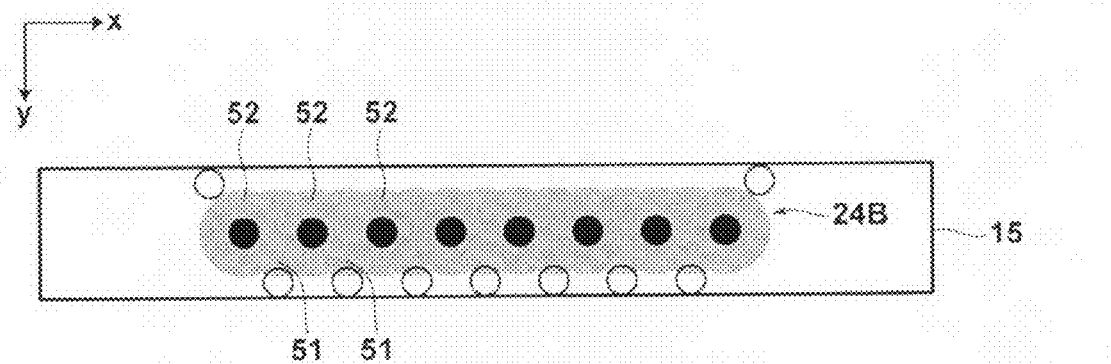
FIG. 21 is a schematic diagram illustrating a process of drawing a straight line pattern according to the fourth embodiment (No. 3)

Next, as illustrated in FIG. 21, droplets of liquid are simultaneously ejected from the nozzles 22 in the second nozzle row 24B, which is the second row, at appropriate ejection timing corresponding to the scan speed in direction y. Accordingly, dots 52 that overlap with the dots 51 are formed.

The interval Px1 of the nozzles in direction x in the arrangement of nozzles according to the fourth embodiment is less than or equal to diameter 2r of the landed droplet of liquid. Therefore, the dots 52 next to each other contact with each other on the substrate 15, and also contact with the dots 51. The contacted dots join together.

Figure 22:
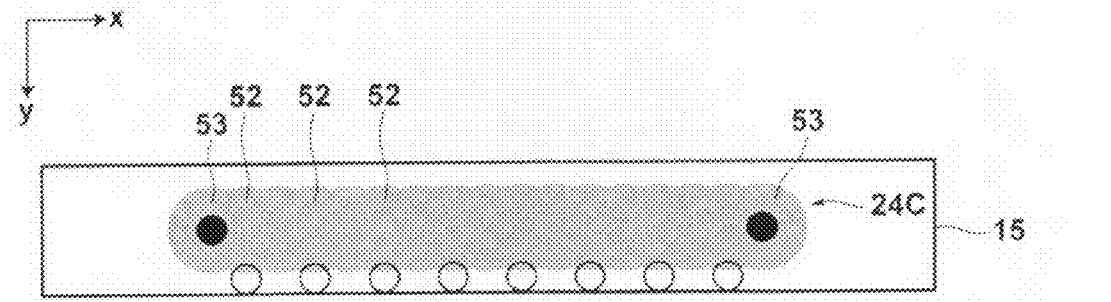
FIG. 22 is a schematic diagram illustrating a process of drawing a straight line pattern according to the fourth embodiment (No. 4)

Next, as illustrated in FIG. 22, droplets of liquid are ejected from the third nozzle row 24C at appropriate ejection timing corresponding to the scan speed in direction y. Accordingly, dots 53 that overlap with the dots 52 located at the ends of the drawn pattern are formed. In this case, the dots 53 contact with the dots 52, and join together.

Figure 23:
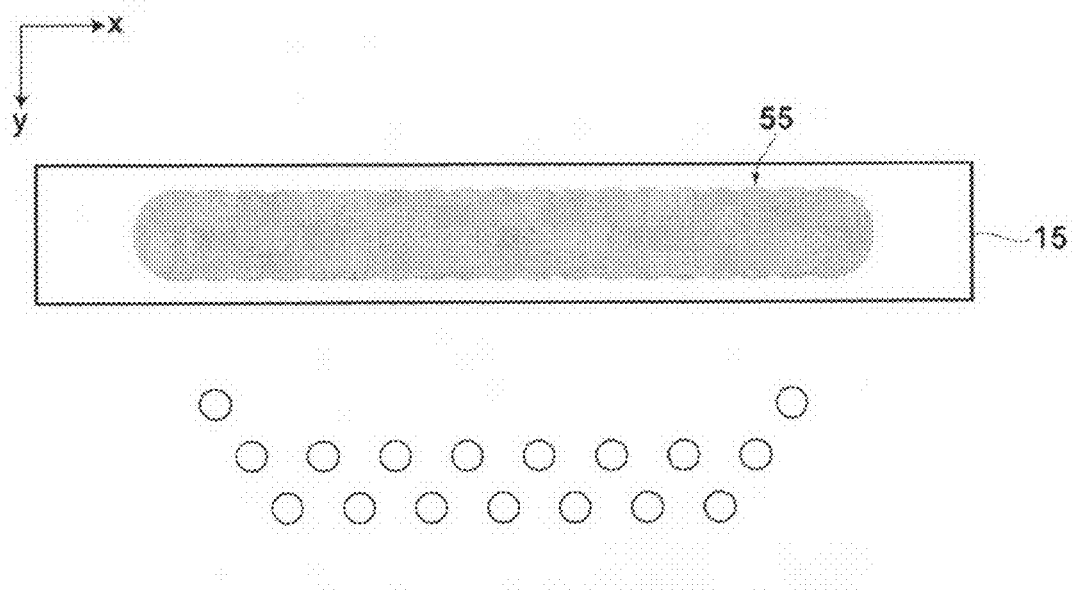
FIG. 23 is a schematic diagram illustrating a process of drawing a straight line pattern according to the fourth embodiment (No. 5).

As described above, the landed droplets of liquid in direction x join together, and a predetermined length of straight line (segment) 55 is drawn. FIG. 23 is a diagram illustrating a state in which the head 2 has moved after drawing the segment 55.

In FIGS. 20 through 23, the dots are illustrated in circular form to clearly indicate the positional relationship of the dots. However, in actual drawing, when the landed droplets of liquid join together on the substrate 15, the outline of the segment 55 becomes a smooth straight line, which does not include uneven portions corresponding to the dots, and jaggies are not generated.

Next, the head 2 is moved in direction x by the distance of the segment 55, and the head 2 reaches the drawing position illustrated in FIG. 20. Then, the droplet ejection control operations illustrated in FIGS. 20 through 23 and the movement of the head 2 in direction x by a distance corresponding to the length of the segment 55 are repeated. Accordingly, a straight line pattern in which a plurality of segments 55 are connected to each other is drawn on the substrate 15.

As illustrated in FIG. 20 through 23, in the fourth embodiment, drawing is started not from an end of the segment 55 but from the middle portion of the segment 55. Therefore, it is possible to prevent the straight line pattern from becoming thick at the start position of the straight line pattern.

In the fourth embodiment, droplets of liquid are ejected to the ends of the segment 55 by the third nozzle row 24C, which is the last nozzle row with respect to the scan direction of the head 2 (direction y). Therefore, the third nozzle row 24C in the fourth embodiment corresponds to the second and third nozzle rows in the claims of the present application.

In the fourth embodiment, the number of the nozzle rows is three. However, it is not necessary the number is three, and the number of the nozzle rows may be an appropriate number that is greater than or equal to three. In this case, the nozzle row that ejects droplets of liquid to draw the ends of the segment should be the last nozzle row, in which the interval between the nozzles at both ends of the row is longest. However, it is not necessary that the ends of the segment are drawn by the last nozzle row. The ends of the segment may be drawn by any nozzle row that is located in the third or later row. In this case, with respect to the nozzle rows that are located behind the nozzle row that draws the ends of the straight line pattern, droplet ejection control should be performed in such a manner that ejection of ink from the nozzles that are located on the outside of each of the ends of the pattern is stopped.

Further, in the first through fourth embodiments, a case in which the present invention is applied to an apparatus for drawing circuits on an electronic circuit board (substrate) has been described as an example. However, application of the present invention is not limited to the apparatus for drawing circuits. The present invention may be applied to various apparatuses, such as apparatuses for producing various kinds of devices, resist print apparatuses that use resin liquid as functional liquid for ejecting, and micro structure formation apparatuses. The present invention may be applied to various apparatuses that can form linear image patterns.

What is claimed is:

1. A line drawing method for drawing a linear pattern on a non-permeable medium by applying droplets of liquid onto the non-permeable medium by using an inkjet method, wherein drawing of the linear pattern is started from a middle portion of the linear pattern, and wherein when the dot pitches of the droplets of liquid are p[μm], the diameters of the droplets of liquid are d[μm], and contact angles between the non-permeable medium and the droplets of liquid are θ[rad], the dot pitches p[μm] satisfy the following condition:

$$p \le \frac{\pi d}{6\left(\frac{\theta}{\sin^2\theta} - \frac{\cos\theta}{\sin\theta}\right)\left\{\tan\frac{\theta}{2}\left(3 + \tan^2\frac{\theta}{2}\right)\right\}^{\frac{2}{3}}}.$$

2. A line drawing method, as defined in claim 1, wherein the linear pattern is drawn by ejecting the droplets of liquid from an inkjet head including a plurality of linearly-arranged nozzles onto the non-permeable medium while the inkjet head and the non-permeable medium are moved relative to each other, the method comprising the steps of:
    moving the inkjet head and the non-permeable medium relative to each other in a direction along which the plurality of nozzles are arranged;
    ejecting a droplet of liquid from a first nozzle that is located at a leading position among the plurality of nozzles with respect to the direction of the forward movement of the inkjet head relative to the non-permeable medium after the first nozzle has passed a start position of the linear pattern;
    ejecting the droplets of liquid from the plurality of nozzles to the non-permeable medium sequentially in the order of arrangement of the plurality of nozzles from the first nozzle toward a second nozzle that is located farthest from the first nozzle with respect to the direction of the forward movement of the inkjet head while the droplets of liquid are ejected from the first nozzle;
    ejecting the droplet of liquid from the second nozzle onto the start position of the linear pattern; and
    ejecting the droplet of liquid from at least one of the plurality of nozzles after the droplet of liquid is ejected onto the start position.

3. A line drawing method, as defined in claim 1, wherein the linear pattern is drawn by ejecting the droplets of liquid from an inkjet head including a plurality of nozzles arranged in V form onto the non-permeable medium while the inkjet head and the non-permeable medium are moved relative to each other, the method comprising the steps of:
    moving the inkjet head and the non-permeable medium relative to each other in a first direction in such a manner that a nozzle located at a bottom portion of the V form of the plurality of nozzles is located at the leading position among the plurality of nozzles;
    ejecting the droplet of liquid from the nozzle located at the bottom portion of the V form;
    ejecting the droplets of liquid from nozzles located over the linear pattern to the non-permeable medium sequentially in the order of arrangement of the plurality of nozzles from the bottom portion of the V form toward upper portions of the V form while the inkjet head and the non-permeable medium are moved relative to each other in the first direction;
    moving the inkjet head and the non-permeable medium relative to each other in a second direction that is perpendicular to the first direction after completing ejection of the droplets of liquid in the order of arrangement of the plurality of nozzles from the bottom portion of the V form toward the upper portions of the V form; and
    repeating the step of ejecting the droplets of liquid from the nozzles to the non-permeable medium in the order of arrangement of the plurality of nozzles from the bottom portion of the V form toward the upper portions of the V form and movement of the inkjet head in the second direction relative to the non-permeable medium.

4. A line drawing method, as defined in claim 1, wherein the linear pattern is drawn by ejecting the droplets of liquid from an inkjet head including a plurality of nozzles arranged in V form onto the non-permeable medium while the inkjet head and the non-permeable medium are moved relative to each other, the method comprising the steps of:
    moving the inkjet head and the non-permeable medium relative to each other in a first direction in such a manner that a nozzle located at a bottom portion of the V form of the plurality of nozzles is located at a leading position among the plurality of nozzles;
    ejecting the droplet of liquid from the nozzle located at the bottom portion of the V form;
    ejecting the droplets of liquid from nozzles located over the linear pattern to the non-permeable medium sequentially in the order of arrangement of the plurality of nozzles from the bottom portion of the V form toward upper portions of the V form while the inkjet head and the non-permeable medium are moved relative to each other in the first direction;
    moving the inkjet head and the non-permeable medium relative to each other in a second direction that is perpendicular to the first direction after completing ejection of the droplets of liquid in the order of arrangement of the plurality of nozzles from the bottom portion of the V form toward the upper portions of the V form; and
    ejecting the droplet of liquid from at least one of the nozzles at the upper portions of the V form while the inkjet head and the non-permeable medium are moved in the second direction relative to each other.

5. A line drawing method, as defined in claim 1, wherein the linear pattern is drawn by ejecting the droplets of liquid from an inkjet head including at least three rows of linearly-arranged nozzles onto the non-permeable medium while the inkjet head and the non-permeable medium are moved relative to each other, and wherein an interval between nozzles at both ends of each of the at least three rows of linearly-arranged nozzles increases, row by row, at least from a first nozzle row of the at least three rows that has a smallest interval toward a second nozzle row of the at least three rows that is away from the first nozzle row at least by two rows of linearly-arranged nozzles, and wherein the nozzles in the at least three rows of nozzles are arranged in such a manner that they do not overlap with each other in a first direction that is perpendicular to each of the at least three rows of nozzles, the method comprising the steps of:

moving the inkjet head and the non-permeable medium relative to each other in the first direction in such a manner that the first nozzle row is located at the leading position among the at least three rows of nozzles;

ejecting the droplets of liquid from the first nozzle row;

ejecting the droplets of liquid from nozzles located over the linear pattern to the non-permeable medium sequentially in the order of arrangement of the at least three rows of nozzles from the first nozzle row toward a third nozzle row of the at least three rows of nozzles that is located at the last position among the at least three rows of nozzles with respect to a forward direction of the at least three rows of nozzles, and while the droplets of liquid are ejected, the droplets of liquid being ejected from the second nozzle row onto the ends of the linear pattern;

moving the inkjet head and the non-permeable medium relative to each other in a second direction that is perpendicular to the first direction after completing ejection of the droplets of liquid in the order of arrangement of the at least three rows of nozzles from the first nozzle row toward the third nozzle row; and repeating the step of ejecting the droplets of liquid to the non-permeable medium in the order of arrangement of the at least three rows of nozzles from the first nozzle row to the third nozzle row and movement of the inkjet head in the second direction relative to the non-permeable medium.

6. A line drawing method, as defined in claim 1, wherein an interval of printing with dots formed by the droplets of liquid is less than or equal to 1 ms.

* * * * *